(12) United States Patent
Koestler et al.

(10) Patent No.: US 11,881,532 B2
(45) Date of Patent: Jan. 23, 2024

(54) STACKED MULTI-JUNCTION SOLAR CELL

(71) Applicant: AZUR SPACE Solar Power GmbH, Heilbronn (DE)

(72) Inventors: Wolfgang Koestler, Heilbronn (DE); Alexander Frey, Flein (DE)

(73) Assignee: AZUR SPACE Solar Power GmbH, Heilbronn (DE)

( * ) Notice: Subject to any disclaimer, the term of this patent is extended or adjusted under 35 U.S.C. 154(b) by 0 days.

(21) Appl. No.: 17/101,494

(22) Filed: Nov. 23, 2020

(65) Prior Publication Data
US 2021/0159349 A1    May 27, 2021

(30) Foreign Application Priority Data
Nov. 21, 2019 (DE) .................. 10 2019 008 106.4

(51) Int. Cl.
*H01L 31/0216* (2014.01)
*H01L 31/0224* (2006.01)
(Continued)

(52) U.S. Cl.
CPC .. *H01L 31/02168* (2013.01); *H01L 31/02245* (2013.01); *H01L 31/18* (2013.01); *H01L 31/0687* (2013.01)

(58) Field of Classification Search
CPC ......... H01L 31/02168; H01L 31/02245; H01L 31/0687
See application file for complete search history.

(56) References Cited

U.S. PATENT DOCUMENTS 5,412,249 A    5/1995  Hyugaji et al.
5,716,459 A *  2/1998  Chang ............. H01L 31/035272
                                                 136/249
(Continued)

FOREIGN PATENT DOCUMENTS

CN    102222706 A    10/2011
EP      1715529 A2   10/2006
(Continued)

OTHER PUBLICATIONS

Chun-Yen Tseng et al: "Performance enhancement of III-V compound multijunction solar cell incorporating transparent electrode and surface treatment" Progress in Photovoltaics: Research and Applications, vol. 19, No. 4, Jun. 2011, pp. 436-441, XP008177784.
(Continued)

*Primary Examiner* — Tamir Ayad
(74) *Attorney, Agent, or Firm* — Muncy, Geissler, Olds & Lowe, P.C.

(57) ABSTRACT

A stacked multi-junction solar cell with a front side contacted through the rear side and having a solar cell stack having a Ge substrate layer, a Ge subcell, and at least two III-V subcells, with a through contact opening, a front terminal contact, a rear terminal contact, an antireflection layer formed on a part of the front side of the multi-junction solar cell, a dielectric insulating layer, and a contact layer. The dielectric insulating layer covers the antireflection layer, an edge region of a top of the front terminal contact, a lateral surface of the through contact opening, and a region of the rear side of the solar cell stack adjacent to the through contact opening. The contact layer from a region of the top of the front terminal contact that is not covered by the dielectric insulating layer through the through contact opening to the rear side.

19 Claims, 4 Drawing Sheets

(51) Int. Cl.
*H01L 31/0687* (2012.01)
*H01L 31/18* (2006.01)

(56) References Cited

U.S. PATENT DOCUMENTS

| | | | |
|---|---|---|---|
| 6,323,416 B1* | 11/2001 | Komori | H01L 31/048 |
| | | | 136/259 |
| 9,006,562 B2 | 4/2015 | Xiong et al. | |
| 9,018,094 B2* | 4/2015 | Kosenko | H01L 23/481 |
| | | | 438/668 |
| 9,508,876 B2 | 11/2016 | Zimmermann | |
| 9,680,035 B1 | 6/2017 | Chary et al. | |
| 11,316,058 B2 | 4/2022 | Koestler et al. | |
| 2003/0175557 A1* | 9/2003 | Anderson | G02B 1/116 |
| | | | 428/698 |
| 2006/0126695 A1* | 6/2006 | Koyama | H01S 5/0264 |
| | | | 372/50.124 |
| 2006/0231130 A1 | 10/2006 | Sharps et al. | |
| 2008/0264476 A1 | 10/2008 | Sharps et al. | |
| 2009/0159123 A1 | 6/2009 | Kothari et al. | |
| 2014/0048128 A1 | 2/2014 | Meitl et al. | |
| 2014/0109952 A1* | 4/2014 | Jang | H01L 31/02366 |
| | | | 136/246 |
| 2015/0034155 A1 | 2/2015 | Lin et al. | |
| 2017/0213922 A1 | 7/2017 | Lucow et al. | |
| 2017/0345955 A1 | 11/2017 | Chary et al. | |
| 2021/0066516 A1 | 3/2021 | Kubera et al. | |
| 2021/0066519 A1 | 3/2021 | Koestler | |

FOREIGN PATENT DOCUMENTS

| | | |
|---|---|---|
| EP | 3787040 A1 | 3/2021 |
| EP | 3787041 A1 | 3/2021 |
| EP | 3787042 A1 | 3/2021 |
| EP | 3787046 A1 | 3/2021 |
| KR | 1020100021845 A | 2/2010 |
| RU | 2234166 C1 | 8/2004 |
| RU | 2013107130 A | 8/2014 |
| WO | WO2015032241 A1 | 3/2015 |

OTHER PUBLICATIONS

Florian Clement, "The Metal Wrap Through Solar Cell—Development and Characterization," Dissertation, Albert-Ludwigs-Universitaet Freiburg in Breisgau, pp. 1-259 with English Abstract (Feb. 2009).

Oliva et al., "III-V Multi-Junction Metal-Wrap-Through (MWT) Concentrator Solar Cells," 32$^{nd}$ European PV Solar Energy Conf & Exhib., Munich, Germany, pp. 1-5 (Jun. 2016).

* cited by examiner

STACKED MULTI-JUNCTION SOLAR CELL

This nonprovisional application claims priority under 35 U.S.C. § 119(a) to German Patent Application No. 10 2019 008 106.4, which was filed in Germany on Nov. 21, 2019, and which is herein incorporated by reference.

BACKGROUND OF THE INVENTION

Field of the Invention

The present invention relates to a stacked multi-junction solar cell.

Description of the Background Art

In order to reduce the shadowing of the front side of a solar cell, it is possible to arrange both the positive and the negative external contact areas on the rear side. In the case of so-called metal wrap through (MWT) solar cells, contact is made with the front side of the solar cell from the rear side by means of a through contact opening, for example.

Various methods are known for producing a hole or a through contact opening through a solar cell, which result in a corresponding variety of through contact openings or solar cell structures.

Known from "The Metal Wrap Through Solar Cell—Development and Characterization," F. Clement, Dissertation, February 2009 is a production method for a single-junction MWT solar cell from polycrystalline silicon, wherein the through contact openings are created in a polycrystalline silicon substrate layer by means of a UV laser or an IR laser. Only after this is an emitter layer created by means of phosphorus diffusion along the top, the lateral surfaces of the through contact opening, and the bottom of the solar cell. The through contact opening is filled with a conductive via paste, for example a silver paste, by means of screen printing.

A very smooth lateral surface can be achieved in the region of the through hole with the laser, and furthermore no undercuts occur in a laser ablation process. The creation of a hole through an existing p-n junction by means of laser ablation would lead to short circuits, however.

Known from "III-V multi-junction metal-wrap-through (MWT) concentrator solar cells," E. Oliva et al., Proceedings, $32^{nd}$ European PV Solar Energy Conference and Exhibition, Munich, 2016, pp. 1367-1371, is a GaInP/AlGaAs solar cell structure grown in an inverted configuration with through contact openings, wherein the solar cell structure with the p-n junctions is grown epitaxially and only after this are the through contact openings produced by means of dry etching. Subsequently, the lateral surface of the through opening is coated with an insulating layer and the through opening is then filled with electrodeposited copper.

From U.S. Pat. No. 9,680,035 B1, is known a solar cell stack composed of multiple III-V subcells on a GaAs substrate with a front side contacted through the rear side, wherein a hole extending from the top of the solar cell through the subcells into an as-yet unthinned substrate layer is created by means of a wet chemical etching process.

The etching process is based on the fact that the etch rates for the different III-V materials of the solar cell stack that are used do not differ significantly. The hole is first opened at the bottom by thinning of the substrate layer.

Passivation and metallization of the front side and of the hole is performed before the thinning of the substrate layer. The wet chemical etching has the advantage over corresponding dry etching processes that the side walls of the hole have a smoother surface and the passivation layer can be deposited conformally and without defects.

One difficulty consists in that greater effort is required for protecting or sealing the through openings for every mask process carried out after production of the through holes.

SUMMARY OF THE INVENTION

It is therefore an object of the present invention to provide a device that advances the state of the art.

According to an exemplary embodiment of the invention, a stacked multi-junction solar cell with a front side contacted through the rear side is provided, having a solar cell stack with a front side, a rear side, and a through contact opening extending from the front side to the rear side of the solar cell stack.

The stacked multi-junction solar cell additionally has a front terminal contact, a rear terminal contact, a dielectric insulating layer, and a contact layer.

The solar cell stack has, following one another in the stated order, a germanium substrate layer forming the rear side, a germanium subcell, and at least two III-V subcells, and the through contact opening has a continuous lateral surface and an oval perimeter in cross section.

The front terminal contact is arranged on the front side of the solar cell stack and is connected to the front side of the solar cell stack in an integral and electrically conductive manner.

The dielectric insulating layer covers a region of the front side of the solar cell stack that is not covered by the front terminal, an edge region of a top of the front terminal contact, the lateral surface of the through contact opening, and a region of the rear side of the solar cell stack adjacent to the through contact opening.

The contact layer extends on the dielectric insulating layer from a region of the top of the front terminal contact that is not covered by the dielectric insulating layer through the through contact opening to the rear side of the solar cell stack, and is connected to the top of the front terminal contact in an integral and electrically conductive manner, and is connected to the dielectric insulating layer in an integral manner.

The rear terminal contact covers a region of the rear side of the solar cell stack that is not covered by the dielectric insulating layer, and is connected to the rear side of the solar cell stack in an integral and electrically conductive manner.

It is a matter of course that the individual subcells of the multi-junction solar cell each have a p-n junction and that the layers following the substrate are created epitaxially on one another and/or are joined to one another by wafer bonding.

In addition, it is a matter of course that a germanium subcell has germanium or is made of germanium, wherein even a layer made of germanium may possibly contain other substances in addition to the germanium, in particular dopants, but also impurities.

Similar considerations also apply to the III-V subcells, which have one or more materials from the main groups III and V or are made of such materials or of such a material combination.

One advantage of the multi-junction solar cell according to the invention is that at least the front terminal contacts can be produced prior to the creation of the through contact openings, which is to say that the front side can be completely processed using standard processes.

Another advantage of the multi-junction solar cell according to the invention is that the dielectric layer covers almost the full area of the front side of the solar cell and protects the multi-junction solar cell from damaging environmental influences.

Accordingly, a further advantage of the multi-junction solar cell according to the invention is a high reliability and quality.

The dielectric insulating layer can be implemented as an antireflection layer. In addition to the insulating function, the dielectric insulating layer thus also has the function of suppressing reflections and increasing transmittance. An additional antireflection layer is no longer necessary.

The multi-junction solar cell can have an antireflection layer arranged between the dielectric insulating layer and the solar cell stack, wherein the antireflection layer covers the region of the front side of the solar cell stack that is not covered by the front terminal.

An additional antireflection layer does indeed mean an additional manufacturing step, but in exchange the choice of materials for the antireflection layer is freer. Moreover, a simpler structure can be chosen for the dielectric insulating layer; in particular, the insulating layer can be implemented as a single layer.

The antireflection layer can cover the edge region of the top of the front terminal contact. The antireflection layer can be electrically conductive.

The production method primarily determines whether or not the antireflection layer covers the edge region of the front terminal contact.

The dielectric insulating layer can have TiO and/or $MgF_2$ and/or $Al_2O_3$ and/or $SiO_2$ and/or $Si_3N_4$ and/or $Ta_2O_5$ and/or $ZrO_2$. The said materials are suitable for ensuring the function of electrical insulation as well as for forming a structure that counteracts or suppresses reflections.

The front terminal contact can have a highly doped semiconductor contact layer that is connected in an integral manner to the front side of the solar cell stack and a metal layer that is connected in an integral manner to the semiconductor contact layer.

The III-V subcells can have a joint layer thickness of 5-15 µm.

The through contact opening can have a first diameter at the front side of the multi-junction solar cell of at least 50 µm or at least 100 µm or at least 300 µm, wherein the first diameter is not greater than 1 mm.

A diameter of the through contact opening decreases in steps from the front side to the rear side of the multi-junction solar cell, wherein a first step is formed from a top of the Ge subcell and a second step is formed from a region of the germanium subcell located below a p-n junction of the germanium subcell and each step projects into the through contact opening with one step height over the full perimeter.

The step height of the first step can be at least 5 µm and/or the step height of the second step is at least 6 µm or at least 7 µm. In one improvement, the step height of the first step is a maximum of 100 µm and/or the step height of the second step is a maximum of 500 µm.

The germanium subcell can have, together with the germanium substrate, a layer thickness of 80-300 µm or of 140-160 µm or of 80-120 µm.

The contact layer can be designed as a multilayer system comprising, in the stated order, a first layer that includes gold and germanium with a layer thickness of at least 2 nm and at most 50 nm, a second layer that includes titanium with a layer thickness of at least 10 nm and at most 300 nm, a third layer that includes palladium or nickel or platinum with a layer thickness of at least 5 nm and at most 300 nm, and at least one metallic fourth layer with a layer thickness of at least 2 µm.

In this design, the first layer can be adjacent to the dielectric insulating layer and the front terminal contact.

The combination according to the invention of layers ensures a reliable integral connection to the top of the front terminal contact and to the surface of the dielectric insulating layer.

Further, a production method is provided for a stacked multi-junction solar cell with a front side contacted through the rear side, comprising at least the steps: provision of a semiconductor wafer having a top, a bottom, and comprising multiple solar cell stacks, wherein each solar cell stack has, following one another in the stated order, a Ge substrate that forms the bottom of the semiconductor wafer, a Ge subcell, and at least two III-V subcells; Application of a front terminal contact to the top of the semiconductor wafer for each solar cell stack; production of a trench, which has a continuous lateral wall and an oval perimeter in cross section and extends into the semiconductor wafer from a top of the semiconductor wafer at least beyond a p-n junction of the Ge subcell, at a distance from the front terminal contact for each solar cell stack; production of a through hole extending from a bottom of the trench to the bottom of the semiconductor wafer and having a continuous lateral wall and an oval perimeter in cross section for each solar cell stack; application of a dielectric insulating layer along the front side of the semiconductor wafer, the rear side of the semiconductor wafer, and to the lateral wall of the trench as well as the lateral wall of the through hole; removal of the insulating layer on a part of the top of the front terminal contact for each solar cell stack; application of a contact layer extending from the exposed top of the front terminal contact over the dielectric insulating layer through the trench and the through hole to a region of the rear side of the semiconductor wafer adjacent to the through hole and coated with the dielectric insulating layer for each solar cell stack; for each solar cell stack, a rear terminal contact is arranged on the rear side of the semiconductor wafer at a point in time before the application of the dielectric layer, and the dielectric insulating layer on a part of a top of the rear terminal contact is removed at a point in time after the application of the dielectric insulating layer; alternatively, for each solar cell stack, the dielectric insulating layer is removed from a section of the surface of the rear side of the semiconductor wafer at a point in time after the application of the dielectric insulating layer, and a rear terminal contact is applied to the exposed surface section of the rear side of the semiconductor wafer at a subsequent point in time.

It is a matter of course that further contact structures may also be arranged on the front side in addition to the front terminal contact if applicable, wherein possibly no surface region of the additional contact structures will be exposed.

The dielectric insulating layer, for example $SiO_2$ and/or $SiN_x$ (silicon nitride), can be applied to the full area of the front and rear sides in a simple manner, for example by means of plasma-enhanced chemical vapor deposition (PECVD).

Moreover, it is not necessary for the dielectric layer according to the inventive method to be structured over large areas. Only in a region above the front terminal contacts is the applied dielectric insulating layer removed or opened.

The dielectric insulating layer can be removed by means of an etching step and/or by means of a laser. Removal by means of a laser has the advantage that typical etch damage, such as pinholes, is avoided. In this way, the method according to the invention ensures high reliability and quality of the cells that are produced. Moreover, hydrofluoric acid processes can be avoided, thus protecting the environment and improving workplace safety.

Prior to production of the trench, an antireflection layer can be applied to a part of the top of the semiconductor wafer that is not covered by the front terminal contacts, wherein, after the removal of the insulating layer on a part of a top of the front terminal contact for each solar cell stack, the antireflection layer is also removed from the part of the top of the front terminal contact. According to one improvement, the removal of the insulating layer and antireflection layer is carried out in the same process step.

The dielectric insulating layer can be designed as an antireflection layer. For example, an insulating layer with a layer structure comprising at least one layer composed of TiO and/or $MgF_2$ and/or $Al_2O_3$ and/or $SiO_2$ and/or $Si_3N_4$ and/or $Ta_2O_5$ and/or $ZrO_2$ is applied, which performs the function of electrical insulation as well as the function of suppressing reflection.

The dielectric insulating layer can be deposited with a transparency matched to the antireflection layer and with a refractive index matched to the antireflection layer. Transparency and refractive index correspond to a cover glass to be applied later and to the silicone adhesive used for this purpose, for example.

An advantage of the method according to the invention is the simplified process control with only a few process steps. Photolithographic and wet chemical etching steps, in particular, are unnecessary.

As a result, the method according to the invention represents an especially simple and economical production method.

Moreover, the dielectric insulating layer remaining on the plane of the top of the multi-junction solar cell protects the cell from damaging environmental influences.

A first highly doped semiconductor contact layer can be applied to the front side of the semiconductor wafer, and a metal layer is applied to a top of the highly doped semiconductor contact layer, as front terminal contact.

The front terminal contact can be applied by means of at least one mask process.

The trench can be created by means of an etching process, wherein, according to a further improvement, the etching process for producing the trench comprises two etching steps, for example a substep that selectively etches the material of the III-V subcells and a substep that also etches the germanium.

The trench can be created by means of a laser ablation process. An opening with a smooth lateral surface is created in a relatively fast and simple way by means of laser ablation.

The combination of an etching process to create a trench extending across all p-n junctions with a laser ablation process permits rapid creation of a through hole even through substrate layers that have not yet been thinned, and at the same time prevents short circuits in the region of the p-n junctions caused by the energy input of the laser.

The dielectric insulating layer can be removed from the top of the front terminal contact and/or from the bottom of the semiconductor wafer by means of a laser ablation process or by means of an etching process.

The Ge substrate can be thinned from the rear side of the semiconductor wafer after the production of the trench or after the production of the through hole. If the substrate is thinned after trench etching and before laser production of the through hole, then the laser ablation process is accelerated or shortened.

Even though thinning after the laser ablation process prolongs the process, it does increase the stability during any further process steps to be performed, which results in less breakage and thus in improved yield.

The thinning can be performed over the full area, for example, or alternatively by means of the so-called TAIKO process.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1A:
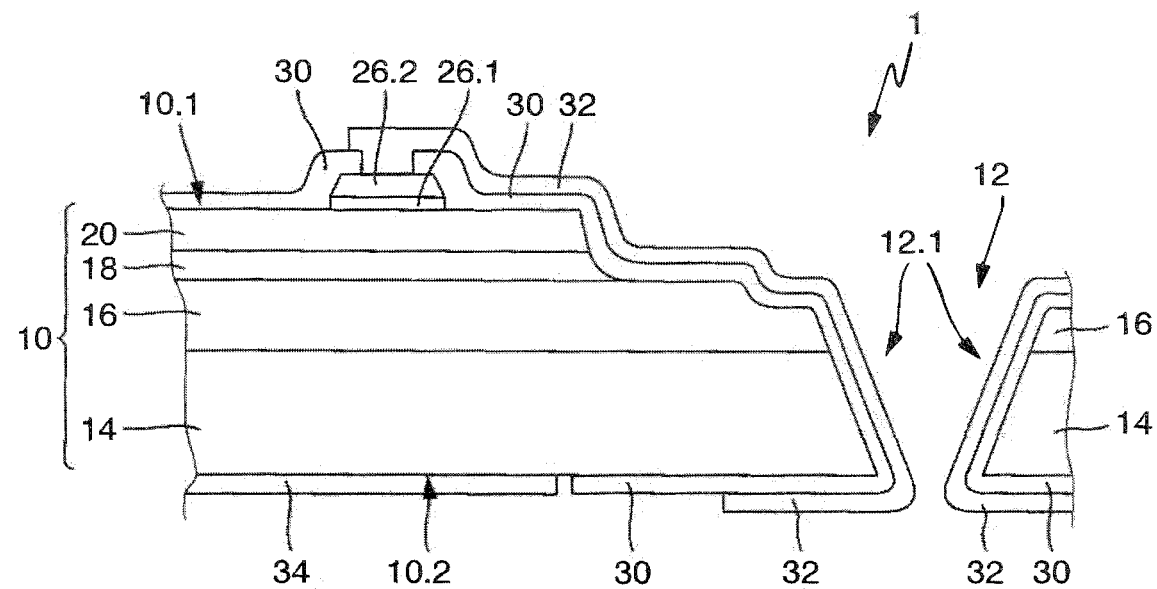
FIG. 1A is a cross section of an embodiment according to the invention of a stacked multi-junction solar cell with a front side contacted through the rear side.

The illustration in FIG. 1A shows a detail in a cross section of a first embodiment according to the invention of a stacked multi-junction solar cell 1 with a front side contacted through the rear side.

The stacked multi-junction solar cell has a solar cell stack 10 with a front side 10.1, a rear side 10.2, and a through contact opening 12 extending from the front side 10.1 to the rear side 10.2 of the solar cell stack 10. The solar cell stack 10 has, following one another in the stated order, a germanium substrate layer 14 forming the rear side 10.2, a germanium subcell 16, and two III-V subcells 18 and 20. The through contact opening 12 has a continuous lateral surface 12.1 and an oval perimeter in cross section.

In addition, the stacked multi-junction solar cell has a front terminal contact 26, a rear terminal contact 34, a dielectric insulating layer 30, and a contact layer 32.

The front terminal contact 26 is formed of a highly doped semiconductor contact layer 26.1, which is arranged on a region of the front side 10.1 of the solar cell stack 10 and is connected in an integral manner to the front side 10.1 of the solar cell stack 10, and a metal layer 26.2, which is connected in an integral manner to the semiconductor contact layer 26.1.

The rear terminal contact 34 covers a region of the rear side 10.2 of the solar cell stack 10, and is connected in an integral manner to the rear side 10.2 of the solar cell stack 10 in the covered region.

The dielectric insulating layer 30 covers a region of the front side 10.1 of the solar cell stack 10 that is not covered by the front terminal 26, an edge region of a top of the front terminal contact 26, the lateral surface 12.1 of the through contact opening 12, and a region of the rear side 10.2 of the solar cell stack 10 adjacent to the through contact opening 12, so that, in a projection perpendicular to the front side 10.1 of the solar cell stack, only a central region of the front terminal contact 26 is not covered by the insulating layer 30. In a projection perpendicular to the rear side 10.2 of the solar cell stack, the insulating layer 30 surrounds the through contact opening and extends at most to the rear terminal contact 34.

The contact layer 32 extends on the dielectric insulating layer 30 from a region of the top of the front terminal contact 26 that is not covered by the dielectric insulating layer 30 through the through contact opening 12 to the rear side 10.2 of the solar cell stack 10, and in this way allows contact to be made with the front terminal contact 26 on the rear side 10.2 of the solar cell stack. The contact layer 32 is connected in an integral and electrically conductive manner to the top of the front terminal contact 26 and in an integral manner to the dielectric insulating layer 30.

The dielectric insulating layer 30 can be implemented as an antireflection layer, which is to say the insulating layer 30 has dielectric or electrically insulating materials and a structure that suppresses reflections.

In the illustration in FIG. 1B, a cross section of an alternative embodiment of a stacked multi-junction solar cell 1 is shown, wherein only the differences from the illustration in FIG. 1A are explained below.

The multi-junction solar cell 1 has an antireflection layer 28, wherein the antireflection layer 28 is arranged between the solar cell stack 10 and the dielectric insulating layer 30.

The antireflection layer 28 covers a region of the front side 10.1 of the solar cell stack 10 that is not covered by the front terminal 26 and the edge region of the front terminal contact 26, and extends to an edge of the through contact opening 12. The dielectric insulating layer 30 covers the antireflection layer 28 completely in the exemplary embodiment shown.

Figure 1B:
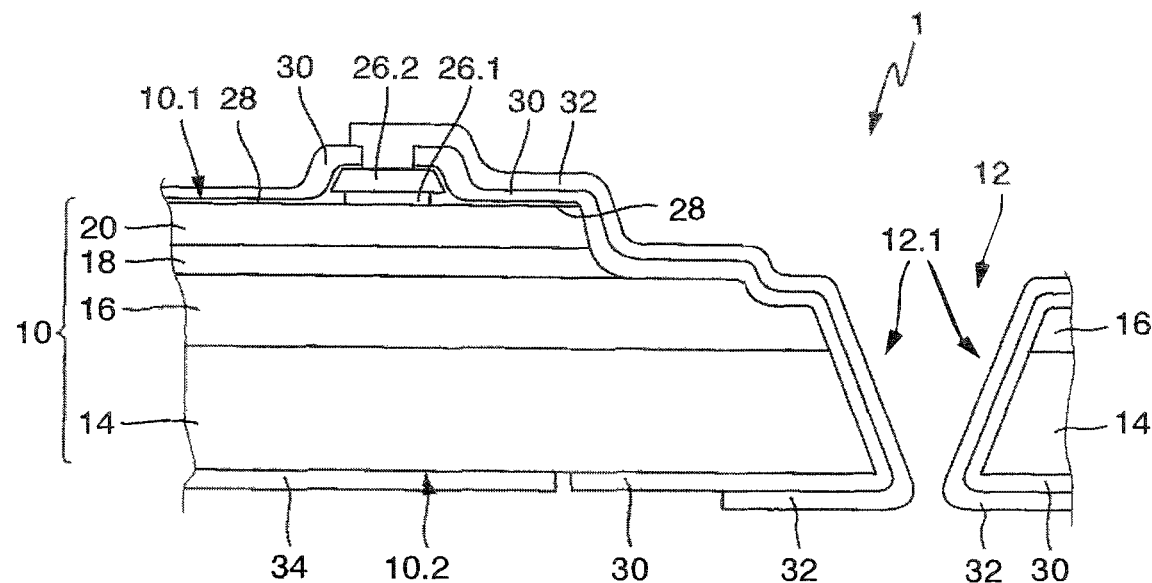
FIG. 1B is a cross section of an embodiment according to the invention of the stacked multi-junction solar cell with the front side contacted through the rear side.
Figure 1C:
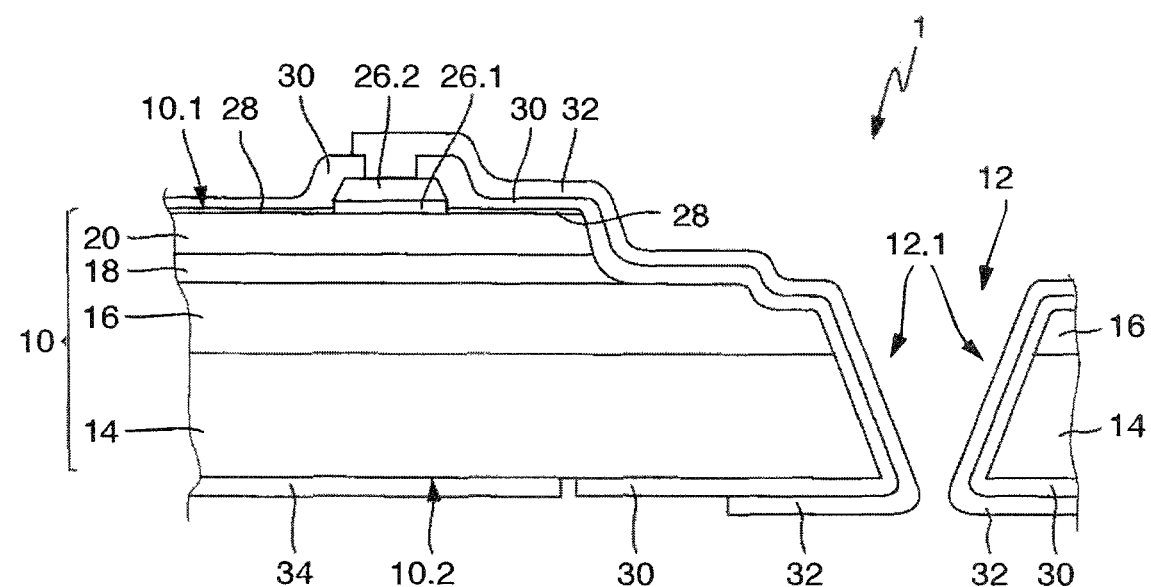
FIG. 1C is a cross section of an embodiment according to the invention of the stacked multi-junction solar cell with the front side contacted through the rear side.

In the illustration in FIG. 1C, a cross section of another alternative embodiment of a stacked multi-junction solar cell 1 is shown, wherein only the differences from the illustrations in FIGS. 1A and 1B are explained below.

The antireflection layer 28 covers the front side 10.1 of the solar cell stack 10 and is adjacent to the front terminal contact 26, so that, in a projection perpendicular to the front side 10.1 of the solar cell stack, the antireflection layer surrounds the front terminal contact and extends to an edge of the through contact opening 12.

Figures 2, 3:
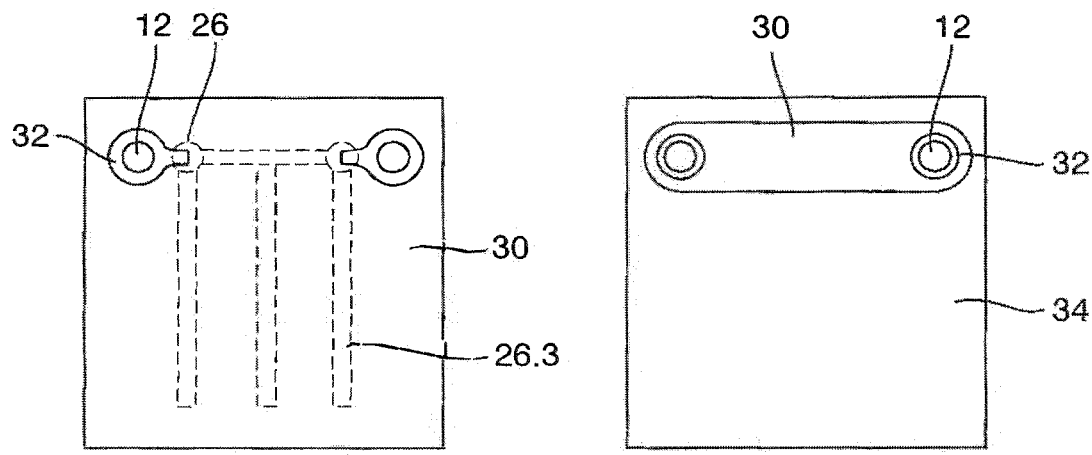
FIG. 2 is a top view of an embodiment according to the invention of the multi-junction solar cell.
FIG. 3 is a rear side of an embodiment according to the invention of the multi-junction solar cell.

In the illustration in FIG. 2, a top view of an embodiment according to the invention of a stacked multi-junction solar cell 1 is shown. Only the differences from the illustration in FIG. 1 are explained below.

The stacked multi-junction solar cell 1 has two through contact openings 12, two front terminal contacts 26, and a front contact structure 26.3 with a land connecting the two front terminal contacts 26 and multiple contact fingers proceeding from the land. It is a matter of course that only one or more than two through contact openings can also be implemented.

The contact layer 32 covers a surface region adjacent to each of the through contact openings 12 and extends in each case to an exposed middle region of the front terminal contacts 26.

A remaining region of the front side 10.1, in particular including the front contact structure 26.3, is covered by the dielectric insulating layer 30.

In the illustration in FIG. 3, a bottom view of an embodiment according to the invention of a stacked multi-junction solar cell 1 is shown. Only the differences from the illustrations in FIG. 1 and FIG. 2 are explained below.

On the rear side 10.2 of the solar cell stack, a region of the rear side 10.2 adjacent to the two through contact openings 12 is surrounded by the contact layer 32. A region of the rear side 10.2, which surrounds the two through contact openings 12 and the edge regions covered by the contact layer 32, is covered by the dielectric insulating layer 30. A remaining region of the surface of the rear side 10.2 of the solar cell stack 1 is covered by the rear terminal contact 34.

Figure 4:
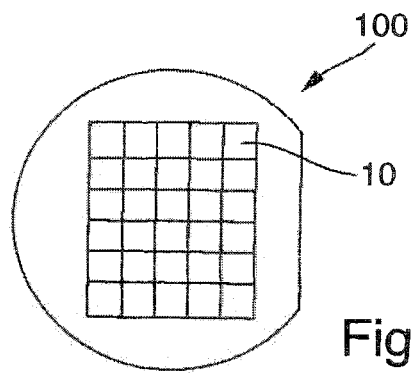
FIG. 4 is a top view of a semiconductor wafer comprising a multiplicity of stacked multi-junction solar cells.

In the illustration in FIG. 4, a top view of an embodiment according to the invention of a semiconductor wafer 100 comprising multiple stacked multi-junction solar cells 1 is shown. Only the differences from the illustration in FIG. 1 are explained below.

The semiconductor wafer 100 includes multiple solar cell stacks 1 that have not yet been diced, so that the rear sides 10.2 of the individual solar cell stacks 1 each form a part of a bottom of the semiconductor wafer 100, and the tops 10.1 of the individual solar cell stacks 1 each form a part of a top of the semiconductor wafer 100.

Figure 5:
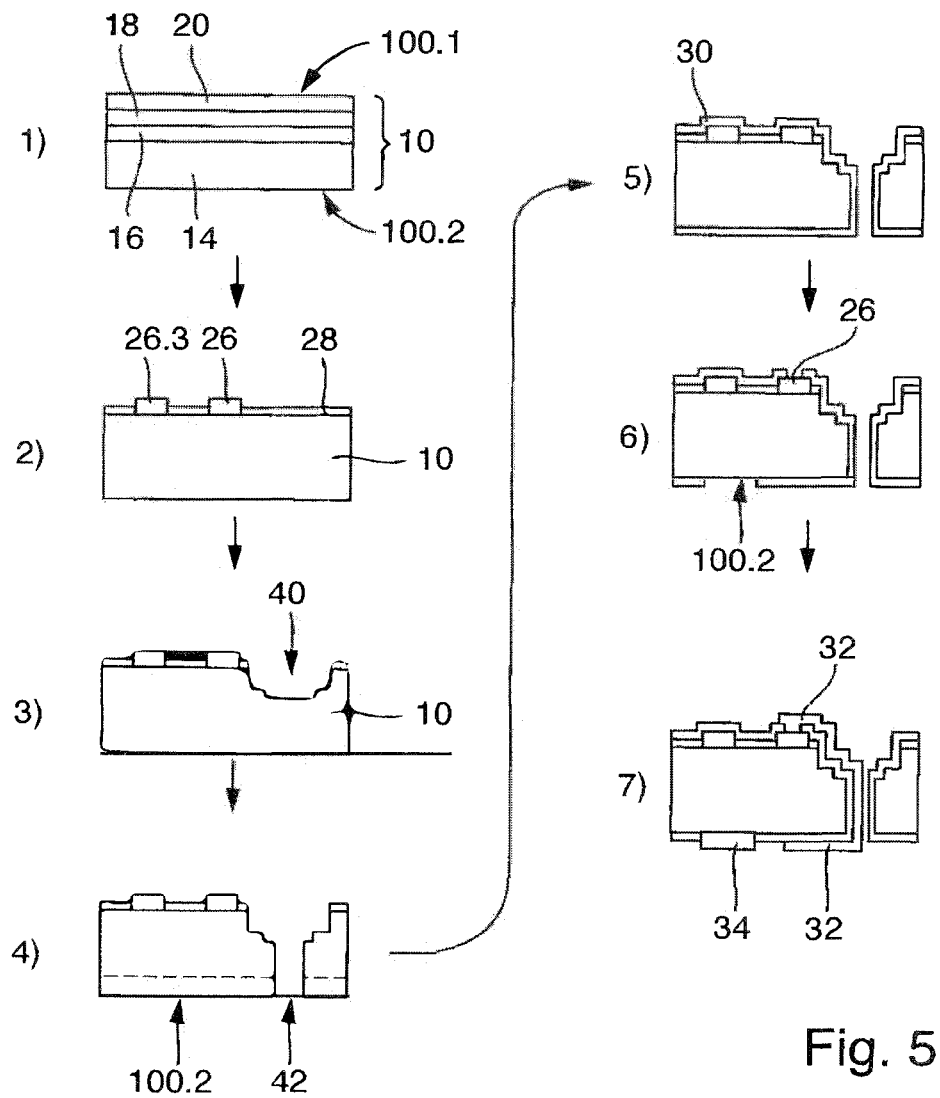
FIG. 5 is a sequence of a production method in accordance with an embodiment according to the invention.

In the illustration in FIG. 5, a first embodiment according to the invention of a sequence of a production method for a stacked multi-junction solar cell 1 is shown.

In a first method step, a semiconductor wafer 100 having a top 100.1 and a bottom 100.2 is provided, wherein the semiconductor wafer 100 comprises multiple solar cell stacks 10, and each solar cell stack 10 has a Ge substrate 14 that forms the bottom 100.2 of the semiconductor wafer 100, a Ge subcell 16, and two III-V subcells 18 and 20, following one another in the stated order.

In a second method step, one front terminal contact 26 and one front contact structure 26.3 for each solar cell stack 10 are applied to the top 100.1 of the semiconductor wafer 100, for example by means of a mask process.

In addition, an antireflection layer 28 is applied to a part of the top 100.1 of the semiconductor wafer 100 that is not covered by the front terminal contacts 26 and is not covered by the front contact structure 26.3, for example by means of a mask process simultaneously for all solar cell stacks of the semiconductor wafer 100.

Next, in a third method step, a trench 40, which has a continuous lateral wall and an oval perimeter in cross section and extends into the semiconductor wafer from a top of the antireflection layer 28 at least beyond a p-n junction of the Ge subcell, is produced at a distance from the front terminal contact 26 for each solar cell stack 10, for example by means of an etching process simultaneously for all solar cell stacks of the semiconductor wafer 100 or by means of laser ablation simultaneously for all or some of the solar cell stacks or sequentially for the individual solar cell stacks.

In a fourth method step, a through hole 42 extending from a bottom of the trench 40 to the bottom 100.2 of the semiconductor wafer 100 and having a continuous lateral wall and a perimeter 12 that is oval in cross section is produced simultaneously or sequentially for each solar cell stack 10, for example likewise by means of an etching process or by means of laser ablation.

In a fifth method step, a dielectric insulating layer 30 is applied along the front side 100.1 of the semiconductor wafer 100, the rear side 100.2 of the semiconductor wafer, and to the lateral wall of each trench 40 as well as the lateral wall of each through hole 42, for example by means of PECVD.

In a sixth method step, the insulating layer 30 is removed on a part of a top of each front terminal contact 26 and from a region of the bottom 100.2 spaced apart from the through hole 42 in each case for each solar cell stack. In one embodiment, the ARC can also be removed therewith in the sixth method step.

In a seventh method step, a contact layer extending from the exposed top of the front terminal contact 26 over the dielectric insulating layer 30 through the trench 40 and the through hole 42 to a region of the rear side 100.2 of the semiconductor wafer 100 adjacent to the through hole 42 and coated with the dielectric insulating layer 30 is applied for each solar cell stack 10. In addition, a rear terminal contact 34 for each solar cell stack is arranged on the region of the rear side 100.2 of the semiconductor wafer 100 exposed through removal of the dielectric insulating layer 30.

Figure 6:
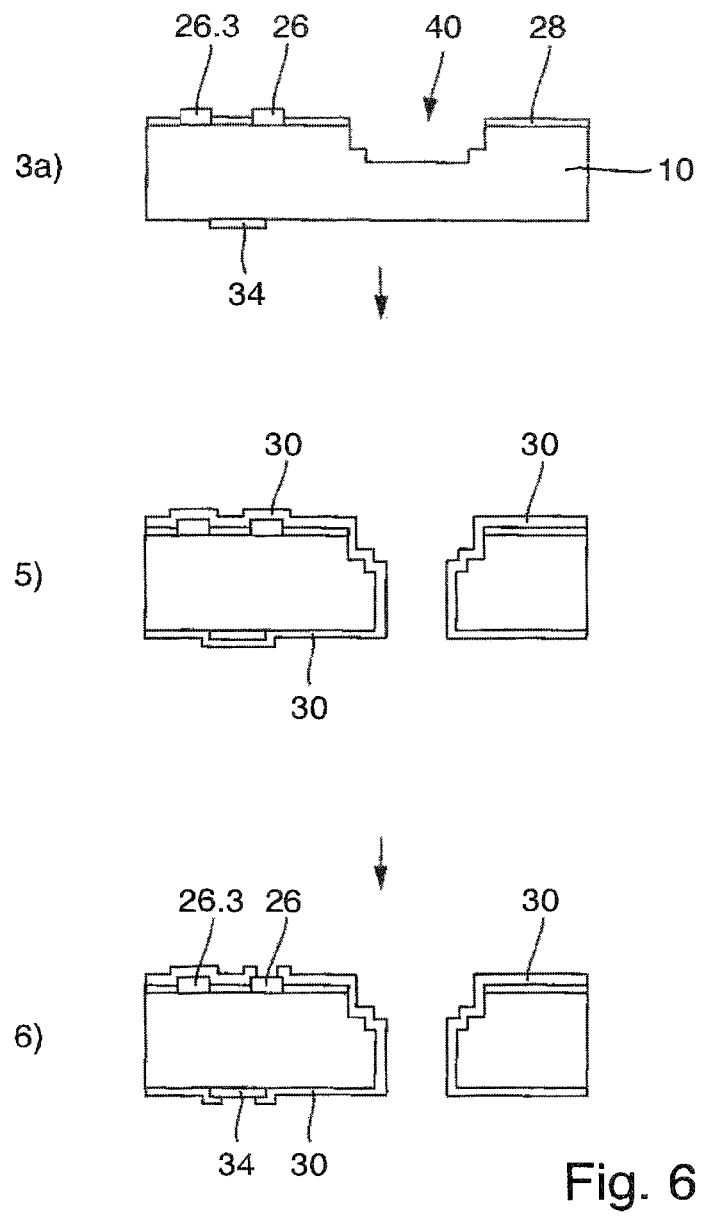
FIG. 6 shows additional method steps of a production method in accordance with an embodiment according to the invention.

In the illustration in FIG. 6, an embodiment of the production method according to the invention for a stacked multi-junction solar cell 1 is shown. Only the differences from the illustration in FIG. 5 are explained below.

As part of the third method step, which is to say before, after, or during the arrangement of the front contact terminal 26 and/or the production of the trench 40, the rear terminal contact 34 is arranged on a region of the rear side 100.2 of the semiconductor wafer 100 spaced apart from the through hole 42 to be produced later.

In a fifth method step, the dielectric insulating layer 30 is also applied to a top of the rear terminal contact 34, and as part of the sixth method step is removed again from a region of the top of the rear terminal contact 34.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A stacked multi-junction solar cell comprising:
a solar cell stack with a front side, a rear side, and a through contact opening extending from the front side to the rear side of the solar cell stack;
a front terminal contact;
a rear terminal contact;
a dielectric insulating layer; and
a contact layer,
wherein the solar cell stack has a germanium substrate layer forming the rear side, a germanium subcell, and at least two III-V subcells, the germanium subcell being formed between the germanium substrate layer and the at least two III-V subcells,
wherein the through contact opening has a continuous lateral surface and an oval perimeter in cross section,
wherein the front terminal contact is arranged on the front side of the solar cell stack and is connected to the front side of the solar cell stack in an integral and electrically conductive manner,
wherein the dielectric insulating layer covers a region of the front side of the solar cell stack that is not covered by the front terminal contact, a portion of a top surface of the front terminal contact, the lateral surface of the through contact opening, and a region of the rear side of the solar cell stack adjacent to the through contact opening, a portion of the dielectric insulating layer being on and vertically above a part of the top surface of the front terminal contact,
wherein the contact layer extends on the dielectric insulating layer from a region of the top surface of the front terminal contact that is not covered by the dielectric insulating layer through the through contact opening to the rear side of the solar cell stack, is connected to the top surface of the front terminal contact in an integral and electrically conductive manner, and is connected to the dielectric insulating layer in an integral manner, a portion of the contact layer being vertically below the back side of the solar cell stack,
wherein a central portion of the through contact opening is empty from a height of the front side of the solar cell stack to a height of the rear side of the solar cell stack, and
wherein the rear terminal contact covers a region of the rear side of the solar cell stack that is not covered by the dielectric insulating layer, and is connected to the rear side of the solar cell stack in an integral and electrically conductive manner.

2. The stacked multi-junction solar cell according to claim 1, wherein the dielectric insulating layer is an antireflection layer.

3. The stacked multi-junction solar cell according to claim 1, further comprising:
an antireflection layer arranged between the dielectric insulating layer and the solar cell stack,
wherein the antireflection layer covers the region of the front side of the solar cell stack that is not covered by the front terminal contact.

4. The stacked multi-junction solar cell according to claim 3, wherein the antireflection layer covers an edge region of the top surface of the front terminal contact.

5. The stacked multi-junction solar cell according to claim 3, wherein the antireflection layer is electrically conductive.

6. The stacked multi-junction solar cell according to claim 1, wherein the dielectric insulating layer has TiO and/or $MgF_2$ and/or $Al_2O_3$ and/or $SiO_2$ and/or $Si_3N_4$ and/or $Ta_2O_5$ and/or $ZrO_2$.

7. The stacked multi-junction solar cell according to claim 1, wherein the front terminal contact comprises:
a doped semiconductor contact layer connected in an integral manner to the front side of the solar cell stack; and
a metal layer connected in an integral manner to the doped semiconductor contact layer.

8. The stacked multi-junction solar cell according to claim 1, wherein the at least two III-V subcells combined have a joint layer thickness of 5 to 15 μm.

9. The stacked multi-junction solar cell according to claim 1, wherein the through contact opening has a first diameter of at least 50 μm at the front side of the solar cell, and wherein the first diameter is not greater than 1 mm.

10. The stacked multi-junction solar cell according to claim 1,
wherein a diameter of the through contact opening decreases in steps from the front side to the rear side of the solar cell stack, and
wherein a first step is formed from a top of the germanium subcell and a second step is formed from a region of the germanium subcell located below a p-n junction of the germanium subcell and each step projects into the through contact opening with one step height over a full perimeter.

11. The stacked multi-junction solar cell according to claim 10, wherein a step height of the first step is at least 5 µm and/or a step height of the second step is at least 6 µm.

12. The stacked multi-junction solar cell according to claim 1, wherein the germanium subcell has, together with the germanium substrate layer, a layer thickness of 80 to 300 µm.

13. The stacked multi-junction solar cell according to claim 1,
wherein the contact layer is a multilayer system comprising, in a stated order, a first layer that includes gold and germanium, a second layer that includes titanium, a third layer that includes palladium or nickel or platinum, and at least one metallic fourth layer, and
wherein the first layer is adjacent to the dielectric insulating layer and to the front terminal contact.

14. The stacked multi-junction solar cell according to claim 1,
wherein there are at least two through contact openings and corresponding at least two front terminal contacts, and
wherein the stacked multi-junction solar cell further comprises a front contact structure (26.3) comprising:
a land connecting the at least two front terminal contacts; and
multiple contact fingers proceeding from the land.

15. The stacked multi-junction solar cell according to claim 3, wherein a transparency of the dielectric insulating layer matches a transparency of the antireflection layer and/or a refractive index of the dielectric insulating layer matches a refractive index of the antireflection layer.

16. The stacked multi-junction solar cell according to claim 1, wherein each of the germanium subcell and the at least two III-V subcells comprises a p-n junction.

17. The stacked multi-junction solar cell according to claim 1,
wherein the portion of the dielectric insulating layer is in physical contact with the part of the top surface of the front terminal contact,
wherein another portion of the dielectric insulating layer is in physical contact with the rear side of the solar cell stack, and
wherein the portion of the contact layer is in physical contact with a lower surface of the another portion of the dielectric insulating layer.

18. The stacked multi-junction solar cell according to claim 4,
wherein a lower surface of the antireflection layer is in physical contact with the front side of the solar cell stack and with the part of the top surface of the front terminal contact,
wherein the portion of the dielectric insulating layer is in physical contact with an upper surface of the antireflection layer,
wherein another portion of the dielectric insulating layer is in physical contact with the rear side of the solar cell stack, and
wherein the portion of the contact layer is in physical contact with a lower surface of the another portion of the dielectric insulating layer.

19. A stacked multi-junction solar cell comprising:
a solar cell stack with a front side, a rear side, and a through contact opening extending from the front side to the rear side of the solar cell stack;
a front terminal contact;
a rear terminal contact;
a dielectric insulating layer; and
a contact layer,
wherein the solar cell stack has a germanium substrate layer forming the rear side, a germanium subcell, and at least two III-V subcells, the germanium subcell being formed between the germanium substrate layer and the at least two III-V subcells,
wherein the through contact opening has a continuous lateral surface and an oval perimeter in cross section,
wherein the front terminal contact is arranged on the front side of the solar cell stack and is connected to the front side of the solar cell stack in an integral and electrically conductive manner,
wherein the dielectric insulating layer covers a region of the front side of the solar cell stack that is not covered by the front terminal contact, an edge region of a top surface of the front terminal contact, the lateral surface of the through contact opening, and a region of the rear side of the solar cell stack adjacent to the through contact opening,
wherein the contact layer extends on the dielectric insulating layer from the top of the front terminal contact that is not covered by the dielectric insulating layer through the through contact opening to the rear side of the solar cell stack, is connected to the top of the front terminal contact in an integral and electrically conductive manner, and is connected to the dielectric insulating layer in an integral manner,
wherein a central portion of the through contact opening is empty from a height of the front side of the solar cell stack to a height of the rear side of the solar cell stack,
wherein the rear terminal contact covers a region of the rear side of the solar cell stack that is not covered by the dielectric insulating layer, and is connected to the rear side of the solar cell stack in an integral and electrically conductive manner,
wherein the contact layer is a multilayer system comprising, in the stated order, a first layer that includes gold and germanium with a layer thickness of at least 2 nm and at most 50 nm, a second layer that includes titanium with a layer thickness of at least 10 nm and at most 300 nm, a third layer that includes palladium or nickel or platinum with a layer thickness of at least 5 nm and at most 300 nm, and at least one metallic fourth layer with a layer thickness of at least 2 µm, and
wherein the first layer is adjacent to the dielectric insulating layer and to the front terminal contact.

* * * * *